United States Patent
Lim et al.

(10) Patent No.: US 11,800,603 B2
(45) Date of Patent: Oct. 24, 2023

(54) AEROSOL GENERATING DEVICE HAVING HEATER

(71) Applicant: KT&G CORPORATION, Daejeon (KR)

(72) Inventors: Hun Il Lim, Seoul (KR); Tae Hun Kim, Yongin-si (KR); Jung Ho Han, Daejeon (KR); Sang Kyu Park, Hwaseong-si (KR)

(73) Assignee: KT&G CORPORATION, Daejeon (KR)

( * ) Notice: Subject to any disclaimer, the term of this patent is extended or adjusted under 35 U.S.C. 154(b) by 85 days.

(21) Appl. No.: 17/580,183

(22) Filed: Jan. 20, 2022

(65) Prior Publication Data

US 2022/0142249 A1    May 12, 2022

Related U.S. Application Data

(63) Continuation of application No. 16/643,146, filed as application No. PCT/KR2018/012899 on Oct. 29, 2018, now Pat. No. 11,622,579.

(30) Foreign Application Priority Data

Oct. 30, 2017 (KR) .......................... 10-2017-0142578
May 15, 2018 (KR) .......................... 10-2018-0055652

(51) Int. Cl.
  *A24F 13/00*    (2006.01)
  *A24F 40/42*    (2020.01)
  (Continued)

(52) U.S. Cl.
  CPC ............ *A24F 40/42* (2020.01); *A24B 15/167* (2016.11); *A24D 1/20* (2020.01); *A24D 3/17* (2020.01);
  (Continued)

(58) Field of Classification Search
  CPC ...................................................... A24F 47/00
  (Continued)

(56) References Cited

U.S. PATENT DOCUMENTS 5,348,027 A    9/1994    Barnes et al.
5,388,594 A    2/1995    Counts et al.
(Continued)

FOREIGN PATENT DOCUMENTS

CA    2778903 A1    5/2011
CA    2 970 045 A1    6/2016
(Continued)

OTHER PUBLICATIONS

Extended European Search Report dated Jan. 15, 2021 in European Application No. 18799246.6.
(Continued)

*Primary Examiner* — Phuong K Dinh
(74) *Attorney, Agent, or Firm* — LEE, HONG, DEGERMAN, KANG & WAIMEY PC

(57) ABSTRACT

Provided is an aerosol generating apparatus including: a heater configured to generate aerosol by heating a cigarette, the heater including a first electrically conductive heating element formed along a first path on an electrically insulating substrate, a second electrically conductive heating element formed along a second path on the electrically insulating substrate, and a temperature sensor track formed along a third path in a region between the first path and the second path; a battery configured to supply power to the heater; and a controller configured to control the power supplied from the battery to the heater and monitor a temperature sensed using the temperature sensor track.

13 Claims, 10 Drawing Sheets

(51) Int. Cl.

| | | |
|---|---|---|
| *A24F 40/90* | (2020.01) | |
| *A24F 40/46* | (2020.01) | |
| *A24B 15/167* | (2020.01) | |
| *A24F 40/20* | (2020.01) | |
| *A24F 40/30* | (2020.01) | |
| *A24D 3/17* | (2020.01) | |
| *A24D 1/20* | (2020.01) | |
| *A24F 40/60* | (2020.01) | |
| *F21V 3/00* | (2015.01) | |
| *F21V 5/00* | (2018.01) | |
| *G02B 19/00* | (2006.01) | |
| *H05B 3/54* | (2006.01) | |
| *A24F 40/485* | (2020.01) | |
| *A24F 40/10* | (2020.01) | |
| *A24F 40/44* | (2020.01) | |
| *A24F 40/40* | (2020.01) | |
| *A24F 40/57* | (2020.01) | |
| *A24F 40/65* | (2020.01) | |
| *H05K 1/02* | (2006.01) | |
| *H05K 1/14* | (2006.01) | |
| *H05K 1/18* | (2006.01) | |
| *A24F 40/50* | (2020.01) | |
| *A24F 40/95* | (2020.01) | |
| *A24F 15/01* | (2020.01) | |
| *A24F 40/51* | (2020.01) | |
| *F21Y 115/10* | (2016.01) | |

(52) U.S. Cl.
CPC .............. *A24F 15/01* (2020.01); *A24F 40/10* (2020.01); *A24F 40/20* (2020.01); *A24F 40/30* (2020.01); *A24F 40/40* (2020.01); *A24F 40/44* (2020.01); *A24F 40/46* (2020.01); *A24F 40/485* (2020.01); *A24F 40/50* (2020.01); *A24F 40/57* (2020.01); *A24F 40/60* (2020.01); *A24F 40/65* (2020.01); *A24F 40/90* (2020.01); *A24F 40/95* (2020.01); *F21V 3/00* (2013.01); *F21V 5/00* (2013.01); *G02B 19/0009* (2013.01); *G02B 19/0061* (2013.01); *H05B 3/54* (2013.01); *H05K 1/0203* (2013.01); *H05K 1/0277* (2013.01); *H05K 1/148* (2013.01); *H05K 1/181* (2013.01); *A24F 40/51* (2020.01); *F21Y 2115/10* (2016.08); *H05K 2201/012* (2013.01); *H05K 2201/0154* (2013.01); *H05K 2201/10219* (2013.01)

(58) Field of Classification Search
USPC .................................................. 131/329, 328
See application file for complete search history.

(56) References Cited

U.S. PATENT DOCUMENTS

| | | |
|---|---|---|
| 5,408,574 A | 4/1995 | Deevi et al. |
| 5,505,214 A | 4/1996 | Collins et al. |
| 5,555,476 A | 9/1996 | Suzuki et al. |
| 5,665,262 A | 9/1997 | Hajaligol et al. |
| 5,692,525 A | 12/1997 | Counts et al. |
| 5,723,228 A | 3/1998 | Okamoto |
| 5,750,964 A | 5/1998 | Counts et al. |
| 5,878,752 A | 3/1999 | Adams et al. |
| 5,949,346 A | 9/1999 | Suzuki et al. |
| 6,026,820 A | 2/2000 | Baggett, Jr. et al. |
| 6,615,840 B1 | 9/2003 | Fournier et al. |
| 6,803,550 B2 | 10/2004 | Sharpe et al. |
| 7,082,825 B2 | 8/2006 | Aoshima et al. |
| 7,682,571 B2 | 3/2010 | Kim et al. |
| 8,205,622 B2 | 6/2012 | Pan |
| 8,558,147 B2 | 10/2013 | Greim et al. |
| 8,602,037 B2 | 12/2013 | Inagaki |
| 8,833,364 B2 | 9/2014 | Buchberger |
| 9,084,440 B2 | 7/2015 | Zuber et al. |
| 9,165,484 B2 | 10/2015 | Choi |
| 9,295,286 B2 | 3/2016 | Shin |
| 9,405,148 B2 | 8/2016 | Chang et al. |
| 9,420,829 B2 | 8/2016 | Thorens et al. |
| 9,516,899 B2 | 12/2016 | Plojoux et al. |
| 9,532,600 B2 | 1/2017 | Thorens et al. |
| 9,693,587 B2 | 7/2017 | Plojoux et al. |
| 9,713,345 B2 | 7/2017 | Farine et al. |
| 9,814,269 B2 * | 11/2017 | Li .............................. H05B 3/44 |
| 9,844,234 B2 | 12/2017 | Thorens et al. |
| 9,848,651 B2 | 12/2017 | Wu |
| 9,854,845 B2 | 1/2018 | Plojoux et al. |
| 10,070,667 B2 | 9/2018 | Lord et al. |
| 10,104,909 B2 | 10/2018 | Han et al. |
| 10,104,911 B2 | 10/2018 | Thorens et al. |
| 10,136,673 B2 | 11/2018 | Mironov |
| 10,143,232 B2 | 12/2018 | Talon |
| 10,390,564 B2 | 8/2019 | Fernando et al. |
| 10,426,193 B2 | 10/2019 | Schennum et al. |
| 10,548,350 B2 | 2/2020 | Greim et al. |
| 10,602,778 B2 * | 3/2020 | Hu .......................... A24F 40/46 |
| 10,617,149 B2 | 4/2020 | Malgat et al. |
| 10,701,973 B2 | 7/2020 | Lee |
| 10,757,975 B2 * | 9/2020 | Batista ..................... H05B 3/26 |
| 10,842,194 B2 | 11/2020 | Batista et al. |
| 11,051,550 B2 * | 7/2021 | Lin ....................... A24F 40/485 |
| 2003/0226837 A1 | 12/2003 | Blake et al. |
| 2004/0089314 A1 | 5/2004 | Felter et al. |
| 2004/0149737 A1 | 8/2004 | Sharpe et al. |
| 2005/0142036 A1 | 6/2005 | Kim et al. |
| 2006/0267614 A1 | 11/2006 | Lee et al. |
| 2007/0007266 A1 | 1/2007 | Sasaki et al. |
| 2007/0074734 A1 | 4/2007 | Braunshteyn et al. |
| 2007/0246382 A1 | 10/2007 | He |
| 2010/0313901 A1 | 12/2010 | Fernando et al. |
| 2011/0226236 A1 | 9/2011 | Buchberger |
| 2013/0014772 A1 | 1/2013 | Liu |
| 2013/0228191 A1 | 9/2013 | Newton |
| 2013/0255675 A1 | 10/2013 | Liu |
| 2014/0069424 A1 | 3/2014 | Poston et al. |
| 2014/0217085 A1 | 8/2014 | Alima |
| 2014/0261487 A1 | 9/2014 | Chapman et al. |
| 2014/0286630 A1 | 9/2014 | Buchberger |
| 2014/0339509 A1 | 11/2014 | Choi et al. |
| 2014/0345633 A1 | 11/2014 | Talon et al. |
| 2014/0353856 A1 | 12/2014 | Dubief |
| 2015/0020831 A1 | 1/2015 | Weigensberg et al. |
| 2015/0223520 A1 | 8/2015 | Phillips et al. |
| 2015/0230521 A1 | 8/2015 | Talon |
| 2015/0282527 A1 | 10/2015 | Henry, Jr. |
| 2015/0327596 A1 | 11/2015 | Alarcon et al. |
| 2016/0103364 A1 | 4/2016 | Nam et al. |
| 2016/0128386 A1 | 5/2016 | Chen |
| 2016/0174613 A1 | 6/2016 | Zuber et al. |
| 2016/0205998 A1 | 7/2016 | Matsumoto et al. |
| 2016/0321879 A1 | 11/2016 | Oh et al. |
| 2016/0324216 A1 | 11/2016 | Li et al. |
| 2016/0345625 A1 | 12/2016 | Liu |
| 2017/0020195 A1 | 1/2017 | Cameron |
| 2017/0042227 A1 | 2/2017 | Gavrielov et al. |
| 2017/0055589 A1 | 3/2017 | Fernando et al. |
| 2017/0119051 A1 | 5/2017 | Blandino et al. |
| 2017/0143041 A1 | 5/2017 | Batista et al. |
| 2017/0164659 A1 | 6/2017 | Schneider et al. |
| 2017/0188634 A1 | 7/2017 | Plojoux et al. |
| 2017/0197043 A1 | 7/2017 | Buchberger |
| 2017/0197046 A1 | 7/2017 | Buchberger |
| 2017/0214261 A1 | 7/2017 | Gratton |
| 2017/0238609 A1 | 8/2017 | Schlipf |
| 2017/0295844 A1 | 10/2017 | Thevenaz et al. |
| 2017/0325505 A1 | 11/2017 | Force et al. |
| 2017/0347715 A1 | 12/2017 | Mironov et al. |
| 2018/0027878 A1 | 2/2018 | Dendy et al. |
| 2018/0028993 A1 | 2/2018 | Dubief |
| 2018/0160733 A1 | 6/2018 | Leadley et al. |
| 2018/0199630 A1 | 7/2018 | Qiu |
| 2019/0059448 A1 | 2/2019 | Talon |

(56) References Cited

U.S. PATENT DOCUMENTS

| | | |
|---|---|---|
| 2019/0159524 A1 | 5/2019 | Qiu |
| 2019/0281896 A1 | 9/2019 | Chapman et al. |
| 2020/0093177 A1 | 3/2020 | Han et al. |
| 2020/0093185 A1 | 3/2020 | Lim |
| 2020/0094997 A1 | 3/2020 | Menon et al. |
| 2020/0154765 A1 | 5/2020 | Lee et al. |
| 2020/0196670 A1 | 6/2020 | Alarcon et al. |
| 2020/0260790 A1 | 8/2020 | Kaufman et al. |
| 2020/0305240 A1 | 9/2020 | Holoubek et al. |
| 2020/0329772 A1 | 10/2020 | Kim et al. |
| 2020/0345076 A1 | 11/2020 | Lim et al. |
| 2020/0359681 A1 | 11/2020 | Han et al. |
| 2020/0404969 A1 | 12/2020 | Zuber et al. |

FOREIGN PATENT DOCUMENTS

| | | |
|---|---|---|
| CN | 1078621 A | 11/1993 |
| CN | 1126425 A | 7/1996 |
| CN | 1190335 A | 8/1998 |
| CN | 101324490 A | 12/2008 |
| CN | 101518361 A | 9/2009 |
| CN | 202385727 U | 8/2012 |
| CN | 102665459 A | 9/2012 |
| CN | 103099319 A | 5/2013 |
| CN | 202907797 U | 5/2013 |
| CN | 103271447 A | 9/2013 |
| CN | 103519351 A | 1/2014 |
| CN | 103974635 A | 8/2014 |
| CN | 103974638 A | 8/2014 |
| CN | 103997922 A | 8/2014 |
| CN | 104146353 A | 11/2014 |
| CN | 204120226 U | 1/2015 |
| CN | 204146340 U | 2/2015 |
| CN | 204393344 U | 6/2015 |
| CN | 104886776 A | 9/2015 |
| CN | 105188430 A | 12/2015 |
| CN | 205072064 U | 3/2016 |
| CN | 205180371 U | 4/2016 |
| CN | 105722416 A | 6/2016 |
| CN | 205358225 U | 7/2016 |
| CN | 205456064 U | 8/2016 |
| CN | 106136331 A | 11/2016 |
| CN | 205671480 U | 11/2016 |
| CN | 106235419 A | 12/2016 |
| CN | 205831079 U | 12/2016 |
| CN | 106418729 A | 2/2017 |
| CN | 106473232 A | 3/2017 |
| CN | 106723379 A | 5/2017 |
| CN | 106998816 A | 8/2017 |
| CN | 206442590 U | 8/2017 |
| CN | 206443214 U | 8/2017 |
| CN | 107183789 A | 9/2017 |
| CN | 107278125 A | 10/2017 |
| CN | 206547882 U | 10/2017 |
| CN | 108013512 A | 5/2018 |
| CN | 110325058 A | 10/2019 |
| CN | 110958841 A | 4/2020 |
| EA | 201290392 A1 | 10/2012 |
| EA | 201290240 A1 | 12/2012 |
| EA | 026076 B1 | 2/2017 |
| EP | 0 438 862 A2 | 7/1991 |
| EP | 0 917 831 A1 | 5/1999 |
| EP | 0 822 760 B1 | 6/2003 |
| EP | 1 947 965 A2 | 7/2008 |
| EP | 2 201 850 A1 | 6/2010 |
| EP | 2 316 286 A1 | 5/2011 |
| EP | 2316286 | 5/2011 |
| EP | 2 327 318 A1 | 6/2011 |
| EP | 2 340 729 A1 | 7/2011 |
| EP | 2340729 | 7/2011 |
| EP | 2368449 A1 | 9/2011 |
| EP | 2 677 273 A1 | 12/2013 |
| EP | 2 921 065 A1 | 9/2015 |
| EP | 3 257 386 B1 | 6/2019 |
| EP | 3 248 486 B1 | 8/2019 |
| EP | 3 569 076 A1 | 11/2019 |
| EP | 3 248 485 B1 | 4/2020 |
| EP | 3 656 229 A2 | 5/2020 |
| GB | 2514893 A | 12/2014 |
| JP | 62-15793 A | 1/1987 |
| JP | 6-73784 U | 10/1994 |
| JP | 7-72809 A | 3/1995 |
| JP | 9-75058 A | 3/1997 |
| JP | 9-161822 A | 6/1997 |
| JP | 9-228919 A | 9/1997 |
| JP | 2003109728 A | 4/2003 |
| JP | 2003-527127 A | 9/2003 |
| JP | 7-184627 A | 7/2004 |
| JP | 2004-212102 A | 7/2004 |
| JP | 2005-199913 A | 7/2005 |
| JP | 2006-292620 A | 10/2006 |
| JP | 3898118 B2 | 3/2007 |
| JP | 2007-101639 A | 4/2007 |
| JP | 2010-266425 A | 11/2010 |
| JP | 2013-509160 A | 3/2013 |
| JP | 2013-524835 A | 6/2013 |
| JP | 2014-216287 A | 11/2014 |
| JP | 2014-533513 A | 12/2014 |
| JP | 2015-13192 A | 1/2015 |
| JP | 205-503916 A | 2/2015 |
| JP | 2015-504669 A | 2/2015 |
| JP | 2015-506170 A | 3/2015 |
| JP | 2015-528307 A | 9/2015 |
| JP | 2016-512033 A | 4/2016 |
| JP | 2016-521552 A | 7/2016 |
| JP | 2017-510270 A | 4/2017 |
| JP | 2017-511123 A | 4/2017 |
| JP | 2017-522876 A | 8/2017 |
| KR | 1999-0081973 A | 11/1999 |
| KR | 20-0203233 Y1 | 11/2000 |
| KR | 10-0304044 B1 | 11/2001 |
| KR | 10-2004-0084899 A | 10/2004 |
| KR | 10-2005-0065896 A | 6/2005 |
| KR | 10-0495099 B1 | 11/2005 |
| KR | 10-2006-0121638 A | 11/2006 |
| KR | 10-0782063 B1 | 12/2007 |
| KR | 100782063 | 12/2007 |
| KR | 10-1012472 B1 | 2/2011 |
| KR | 10-2011-0096548 A | 8/2011 |
| KR | 10-1062248 B1 | 9/2011 |
| KR | 20-2011-0008931 U | 9/2011 |
| KR | 10-1113713 B1 | 2/2012 |
| KR | 10-2012-0027029 A | 3/2012 |
| KR | 10-2012-0050568 A | 5/2012 |
| KR | 20-0460461 Y1 | 5/2012 |
| KR | 10-1174189 B1 | 8/2012 |
| KR | 10-2012-0101637 A | 9/2012 |
| KR | 10-2012-0102131 A | 9/2012 |
| KR | 10-2012-0104533 A | 9/2012 |
| KR | 10-2012-0115488 A | 10/2012 |
| KR | 20-2012-0007263 U | 10/2012 |
| KR | 20-2012-0008751 U | 12/2012 |
| KR | 10-2013-0031025 A | 3/2013 |
| KR | 10-1239080 B1 | 3/2013 |
| KR | 10-2013-0084789 A | 7/2013 |
| KR | 10-2013-0139276 A | 12/2013 |
| KR | 10-2013-0139298 A | 12/2013 |
| KR | 10-1338073 B1 | 12/2013 |
| KR | 10-2014-0116055 A | 10/2014 |
| KR | 10-2014-0116381 A | 10/2014 |
| KR | 10-2014-0118980 A | 10/2014 |
| KR | 10-2014-0119029 A | 10/2014 |
| KR | 10-2014-0135568 A | 11/2014 |
| KR | 10-1465846 B1 | 11/2014 |
| KR | 10-1480423 B1 | 1/2015 |
| KR | 10-1486294 B1 | 1/2015 |
| KR | 10-2015-0099704 A | 9/2015 |
| KR | 10-2015-0111021 A | 10/2015 |
| KR | 10-2016-0005323 A | 1/2016 |
| KR | 10-2016-0012154 A | 2/2016 |
| KR | 10-2016-0031801 A | 3/2016 |
| KR | 10-2016-0052607 A | 5/2016 |
| KR | 10-1631286 B1 | 6/2016 |
| KR | 10-1635340 B1 | 6/2016 |

(56) References Cited

FOREIGN PATENT DOCUMENTS

| | | |
|---|---|---|
| KR | 10-2016-0082570 A | 7/2016 |
| KR | 10-2016-0086118 A | 7/2016 |
| KR | 10-2016-0088163 A | 7/2016 |
| KR | 10-1660214 B1 | 9/2016 |
| KR | 10-1677547 B1 | 11/2016 |
| KR | 10-1679163 B1 | 11/2016 |
| KR | 10-2017-0006282 A | 1/2017 |
| KR | 10-2017-0020807 A | 2/2017 |
| KR | 10-1733448 B1 | 5/2017 |
| KR | 10-2017-0067171 A | 6/2017 |
| KR | 10-2017-0083596 A | 7/2017 |
| KR | 10-2017-0117444 A | 10/2017 |
| KR | 10-2017-0118233 A | 10/2017 |
| KR | 10-2018-0125852 A | 11/2018 |
| KR | 10-2018-0129637 A | 12/2018 |
| KR | 10-2019-0016907 A | 2/2019 |
| RU | 2 132 629 C1 | 7/1999 |
| RU | 2551944 C1 | 6/2015 |
| RU | 2611487 C2 | 2/2017 |
| RU | 2617297 C2 | 4/2017 |
| RU | 2 619 735 C1 | 5/2017 |
| RU | 2015152134 A | 6/2017 |
| WO | 95/27412 A1 | 10/1995 |
| WO | 98/23171 A1 | 6/1998 |
| WO | 2007039794 A2 | 4/2007 |
| WO | 2009/044716 A1 | 4/2009 |
| WO | 2010073122 A1 | 7/2010 |
| WO | 2011/050964 A1 | 5/2011 |
| WO | 2011/063970 A1 | 6/2011 |
| WO | 2013/102609 A2 | 7/2013 |
| WO | 2014/195679 A2 | 12/2014 |
| WO | 2015/035510 A1 | 3/2015 |
| WO | 2015/070402 A1 | 5/2015 |
| WO | 2015/082560 A1 | 6/2015 |
| WO | 2015/174657 A1 | 11/2015 |
| WO | 2015/177046 A1 | 11/2015 |
| WO | 2015/189388 A1 | 12/2015 |
| WO | 2016/012795 A1 | 1/2016 |
| WO | 2016/0092020 A1 | 1/2016 |
| WO | 2016/096337 A1 | 6/2016 |
| WO | 2016/111633 A1 | 7/2016 |
| WO | 2016/123738 A1 | 8/2016 |
| WO | 2016/127541 A1 | 8/2016 |
| WO | 2016120177 A1 | 8/2016 |
| WO | 2016/138689 A1 | 9/2016 |
| WO | 2016/199065 A1 | 12/2016 |
| WO | 2016/199066 A1 | 12/2016 |
| WO | 2016/207407 A1 | 12/2016 |
| WO | 2017/001818 A1 | 1/2017 |
| WO | 2017/005471 A1 | 1/2017 |
| WO | 2017/029089 A1 | 2/2017 |
| WO | 2017/077466 A1 | 5/2017 |
| WO | 2017/163046 A1 | 9/2017 |
| WO | 2017/182485 A1 | 10/2017 |
| WO | 2017/211600 A1 | 12/2017 |
| WO | 2018/190606 A1 | 10/2018 |
| WO | 2018/191766 A1 | 10/2018 |
| WO | 2019/015343 A1 | 1/2019 |

OTHER PUBLICATIONS

Office Action dated May 25, 2020 in Russian Application No. 2019135871.
Office Action dated Jun. 10, 2020 in Korean Application No. 10-2018-0052137.
Office Action dated Oct. 5, 2020 in Korean Application No. 10-2020-0090577.
Office Action dated Oct. 16, 2020 in Korean Application No. 10-2020-0092553.
Extended European Search Report dated Nov. 16, 2020 in European Application No. 20189002.7.
Office Action dated Dec. 8, 2020 in Russian Application No. 2020113632.
Office Action dated Nov. 25, 2020 in Russian Application No. 2020124810.
Office Action dated Jan. 26, 2021 in Japanese Application No. 2020-502671.
Office Action dated Dec. 22, 2020 in Japanese Application No. 2020-502181.
Office Action dated Dec. 22, 2020 in Japanese Application No. 2020-503856.
Extended European Search Report dated Nov. 13, 2020 in European Application No. 20188970.6.
Office Action dated Nov. 10, 2020 in Japanese Application No. 2020-523671.
Office Action dated Nov. 24, 2020 in Russian Application No. 2020124811.
Extended European Search Report dated Sep. 9, 2021 in European Application No. 18873562.5.
Office Action dated Aug. 3, 2021 in Japanese Application No. 2020-503856.
Extended European Search Report dated Aug. 18, 2021 in European Application No. 18874344.7.
Extended European Search Report dated Jul. 30, 2021 in European Application No. 18874446.0.
Extended European Search Report dated Aug. 17, 2021 in European Application No. 18872432.2.
Office Action dated Aug. 17, 2021 in Japanese Application No. 2020-503962.
Extended European Search Report dated Aug. 10, 2021 in European Application No. 18873846.2.
Extended European Search Report dated Aug. 17, 2021 in European Application No. 18873943.7.
Extended European Search Report dated Aug. 10, 2021 in European Application No. 18874742.2.
Extended European Search Report dated Aug. 12, 2021 in European Application No. 18874837.0.
Extended European Search Report dated Aug. 20, 2021 in European Application No. 18874962.6.
Extended European Search Report dated Aug. 6, 2021 in European Application No. 18872527.9.
Extended European Search Report dated Sep. 2, 2021 in European Application No. 18874839.6.
Extended European Search Report dated Jul. 20, 2021 in European Application No. 18872006.4.
Office Action dated Sep. 3, 2021 in Chinese Application No. 201880035480.1.
Office Action dated Aug. 11, 2021 in Chinese Application No. 201880029050.9.
Communication dated Jul. 27, 2020 by the Russian Patent Office in application No. 2020110821.
Communication dated Jun. 11, 2020 by the Korean Patent Office in application No. 10-2018-0051469.
Extended European Search Report dated Oct. 15, 2021 in European Application No. 18872138.5.
Communication dated Dec. 3, 2021 from the Chinese Patent Office in Chinese Application No. 201880049465.2.
Communication dated Dec. 2, 2021 from the Chinese Patent Office in Chinese Application No. 201880048657.1.
Communication dated Dec. 2, 2021 from the Chinese Patent Office in Chinese Application No. 201880048444.9.
Office Action dated Aug. 12, 2019 in Korean Application No. 10-2019-0033722.
Office Action dated Jul. 2, 2019 in Korean Application No. 10-2019-0017392.
Office Action dated Jul. 3, 2019 in Korean Application No. 10-2019-0016835.
Office Action dated May 18, 2019 in Korean Application No. 10-2018-0090063.
Office Action dated Oct. 25, 2019 in Korean Application No. 10-2018-0078296.
Office Action dated Oct. 15, 2019 in Korean Application No. 10-2018-0074188.
Office Action dated Oct. 8, 2019 in Korean Application No. 10-2018-0072992.

(56) References Cited

OTHER PUBLICATIONS

Office Action dated Oct. 8, 2019 in Korean Application No. 10-2018-0072935.
Office Action dated Sep. 6. 2019 in Korean Application No. 10-2018-0069645.
Office Action dated Jul. 10, 2019 in Korean Application No. 10-20113-0064487.
Office Action dated Jun. 24, 2019 in Korean Application No. 10-2018-0062137.
Office Action dated Jun. 19, 2019 in Korean Application No. 10-2018-0059580.
Office Action dated May 13, 2019 in Korean Application No. 10-2018-0058596.
Office Action dated May 3, 2019 in Korean Application No. 10-2018-0055120.
Office Action dated Dec. 9, 2019 in Korean Application No. 10-2018-0052133.
Office Action dated Dec. 9, 2019 in Korean Application No. 10-2018-0051469.
Office Action dated Dec. 9, 2019 in Korean Application No. 10-2018-0051467.
International Search Report dated Apr. 16, 2019 in International Application No. PCT/KR2018/012899.
International Search Report dated Apr. 26, 2019 in International Application No. PCT/KR2018/012895.
International Search Report dated May 17, 2019 in International Application No. PCT/KR2018/012810.
International Search Report dated May 17, 2019 in International Application No. PCT/KR2018/012809.
International Search Report dated May 17, 2019 in International Application No. PCT/KR201B/012808.
International Search Report dated May 3, 2019 in International Application No. PCT/KR2018/012807.
International Search Report dated May 17, 2019 in International Application No. PCT/KR2018/012776.
International Search Report dated Apr. 3, 2019 in International Application No. PCT/KR2018/012775.
International Search Report dated Apr. 3, 2019 in International Application No. PCT/KR2018/012774.
International Search Report dated Apr. 3, 2019 in International Application No. PCT/KR2018/012773.
International Search Report dated May 20, 2019 in International Application No. PCT/KR2018/012685.
International Search Report dated May 21, 2019 in International Application No. PCT/KR2018/012676.
International Search Report dated Nov. 26, 2018 in International Application No. PCT/KR2018/005767.
International Search Report dated Aug. 28, 2018 in International Application No. PCT/KR2018/005693.
International Search Report dated Nov. 2, 2018 in International Application No. PCT/KR2018/005306.
Office Action dated Mar. 13, 2020 in Korean Application No. 10-2018-0106156.
Office Action dated Dec. 19, 2019 in Korean Application No. 10-2018-0090910.
Communication dated April 5, 2019 in Korean Patent Application No. 10-2019-0017393.
Communication dated Apr. 25, 2019 in Korean Patent Application No. 10-2019-0033722.
Communication dated Apr. 25, 2019 in Korean Patent Application No 10-2019-0033723.
Communication dated Jun. 7, 2021 in Canadian Patent Application No. 3,076,886.
Communication dated Feb. 9, 2018 in Korean Patent Application No 10-2017-0056786.
Communication dated Feb. 24, 2021 by the Japanese Patent Office in application No. 2020-5039362.
Communication dated Mar. 23, 2021 by the Japanese Patent Office in application No. 2020-522897.
Communication dated Mar. 2, 2021 by the Japanese Patent Office in application No. 2020-523669.
Communication dated Mar. 30, 2021 by the Japanese Patent Office in application No. 20120-501446.
Communication dated Mar. 16, 2021 by the Japanese Patent Office in application No. 2020-521441.
Communication dated Feb. 9, 2021 by the Japanese Patent Office in application No. 2020-501205.
Communication dated Mar. 16, 2021 by the European Patent Office in application No. 188068719.
European Patent Office Application Serial No. 21210386.5, Search Report dated Mar. 14, 2022, 10 pages.

* cited by examiner

AEROSOL GENERATING DEVICE HAVING HEATER

CROSS-REFERENCE TO RELATED APPLICATIONS

This application is a continuation of U.S. patent application Ser. No. 16/643,146, filed on Feb. 28, 2020, which is the National Stage filing under 35 U.S.C. 371 of International Application No. PCT/KR2018/012899, filed on Oct. 29, 2018, which claims the benefit of earlier filing date and right of priority to Korean Patent Application Nos. 10-2017-0142578, filed on Oct. 30, 2017 and 10-2018-0055652, filed on May 15, 2018, the contents of which are all hereby incorporated by reference herein their entirety.

TECHNICAL FIELD

The present disclosure relates to an aerosol generating apparatus having a heater.

BACKGROUND ART

Recently, the demand for alternative methods of overcoming the shortcomings of general cigarettes has increased. For example, there is increasing demand for a method of generating aerosol by heating an aerosol generating material in cigarettes, rather than by burning cigarettes. Accordingly, studies on a heating-type cigarette or a heating-type aerosol generating device have been actively conducted.

DESCRIPTION OF EXEMPLARY EMBODIMENTS

Technical Problem

Provided is an aerosol generating apparatus having a heater according to various exemplary embodiments. Additional aspects will be set forth in part in the description which follows and, in part, will be apparent from the description, or may be learned by practice of the present disclosure.

Solution to Problem

According to an aspect of the present disclosure, an aerosol generating apparatus includes: a heater configured to generate aerosol by heating a cigarette, the heater including a first electrically conductive heating element formed along a first path on an electrically insulating substrate, a second electrically conductive heating element formed along a second path on the electrically insulating substrate, and a temperature sensor track formed along a third path in a region between the first path and the second path; a battery configured to supply power to the heater; and a controller configured to control the power supplied from the battery to the heater and monitor a temperature sensed using the temperature sensor track.

Also, the first path may be formed at the outer side of the third path on the electrically insulating substrate, and the second path may be formed at the inner side of the third path on the electrically insulating substrate.

Also, the first electrically conductive heating element and the second electrically conductive heating element may be heated by supply of the power, and the temperature sensor track may sense a temperature of the heater according to the heating of the first electrically conductive heating element and the second electrically conductive heating element.

Also, the heater may include: a heating area in which the first electrically conductive heating element, the second electrically conductive heating element, and the temperature sensor track are formed; and a non-heating area which is an area in which ends of the first electrically conductive heating element, the second electrically conductive heating element, and the temperature sensor track are to be electrically connected to the battery.

Also, the first electrically conductive heating element may include a first end and a second end which are on the first path in the heating area, and the second electrically conductive heating element may include a third end and a fourth end which are on the second path in the heating area, and the temperature sensor track may include a fifth end and a sixth end which are on the third path in the heating area, and the fifth end may be located between the first end and the third end in the heating area, and the sixth end may be located between the second end and the fourth end in the heating area.

Also, the non-heating area may include: a first connection portion connecting the first end and the third end to the battery; a second connection portion connecting the second end and the fourth end to the battery; and a pair of via holes respectively formed in the fifth end and the sixth end.

Also, the first connection portion and the second connection portion may be manufactured as an electrically conductive element identical to the first electrically conductive heating element and the second electrically conductive heating element, and may be manufactured to have a greater width or thickness than the first electrically conductive heating element and the second electrically conductive heating element.

Also, the temperature sensor track may include an electrically conductive element having a different thermal coefficient resistance (TCR) or a different resistance value from the first electrically conductive heating element and the second electrically conductive heating element.

Also, the first electrically conductive heating element and the second electrically conductive heating element may have a TCR value between 1200 ppm/° C. and 1800 ppm/° C., and the temperature sensor track may have a TCR value between 3500 ppm/° C. and 4100 ppm/° C.

Also, the first electrically conductive heating element and the second electrically conductive heating element may have a resistance value between 0.7Ω and 0.85Ω at a room temperature of 25° C., and the temperature sensor track may have a resistance value between 12Ω and 14Ω at a room temperature of 25° C.

Also, a distance between the temperature sensor track and the first electrically conductive heating element and a distance between the temperature sensor track and the second electrically conductive heating element may be each at least 0.5 mm.

The heater may be implemented in the form of an internal heater to be inserted into the cigarette to heat the cigarette or in the form of an external heater to heat an outer portion of the cigarette.

According to an aspect of the present disclosure, a heater for an aerosol generating apparatus for generating aerosol by heating a cigarette, includes: a first electrically conductive heating element formed along a first path on an electrically insulating substrate; a second electrically conductive heating element formed along a second path on the electrically insulating substrate; and a temperature sensor track formed along a third path in a region between the first path and the second path.

Advantageous Effects of Disclosure

According to the above description, by arranging a temperature sensor track in a region between different electrically conductive heating elements on an electrically insulating substrate, the temperature sensor track may sense a temperature in a heating portion of a heater uniformly and accurately.

BEST MODE

According to an aspect of the present disclosure, an aerosol generating apparatus includes: a heater for heating a cigarette accommodated in the aerosol generating apparatus to generate aerosol, the heater including a first electrically conductive heating element formed along a first path on an electrically insulating substrate, a second electrically conductive heating element formed along a second path on the electrically insulating substrate, and a temperature sensor track formed along a third path in a region between the first path and the second path; a battery configured to supply power to the heater; and a controller configured to control the power supplied from the battery to the heater and monitor a temperature sensed using the temperature sensor track.

According to another aspect of the present disclosure, a heater for an aerosol generating apparatus for generating aerosol by heating a cigarette, includes: a first electrically conductive heating element formed along a first path on an electrically insulating substrate; a second electrically conductive heating element formed along a second path on the electrically insulating substrate; and a temperature sensor track formed along a third path in a region between the first path and the second path.

MODE OF DISCLOSURE

With respect to the terms in the various exemplary embodiments, the general terms which are currently and widely used are selected in consideration of functions of structural elements in the various exemplary embodiments of the present disclosure. However, meanings of the terms can be changed according to intention, a judicial precedence, the appearance of a new technology, and the like. In addition, in certain cases, a term which is not commonly used can be selected. In such a case, the meaning of the term will be described in detail at the corresponding portion in the description of the present disclosure. Therefore, the terms used in the various exemplary embodiments of the present disclosure should be defined based on the meanings of the terms and the descriptions provided herein.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

Hereinafter, example exemplary embodiments of the present disclosure will be described in detail with reference to the accompanying drawings. The present disclosure can, however, be embodied in many different forms and should not be construed as limited to the exemplary embodiments set forth herein.

Hereinafter, exemplary embodiments of the present disclosure will be described in detail with reference to the drawings.

Figure 1:
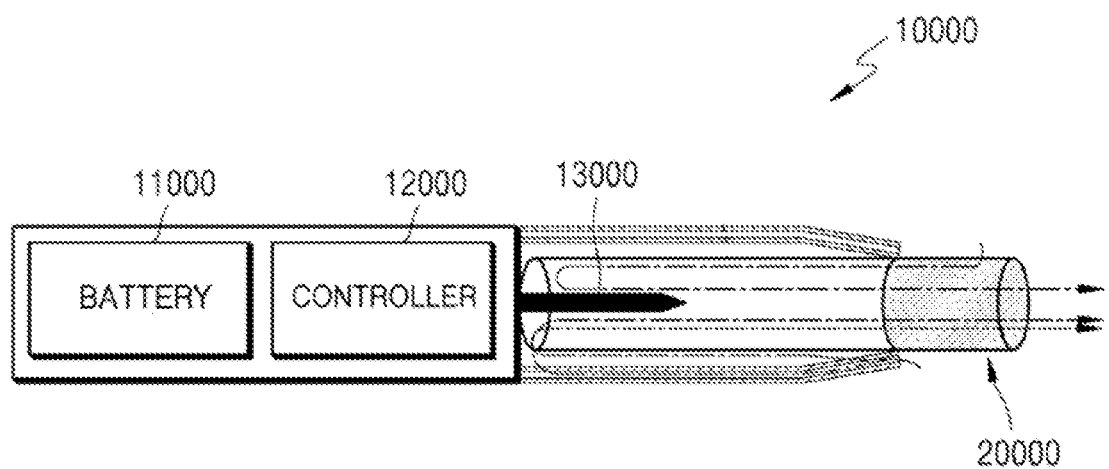
FIGS. 1 through 3 are diagrams showing examples in which a cigarette is inserted into an aerosol generating device.
Figure 2:
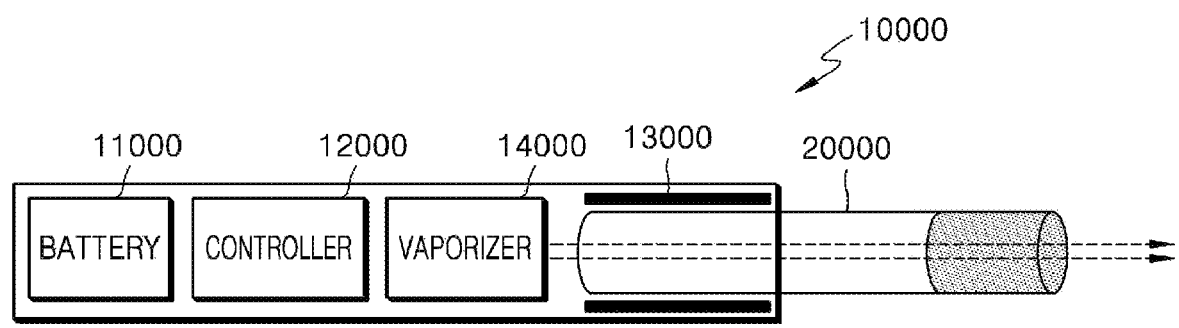
Figure 3:
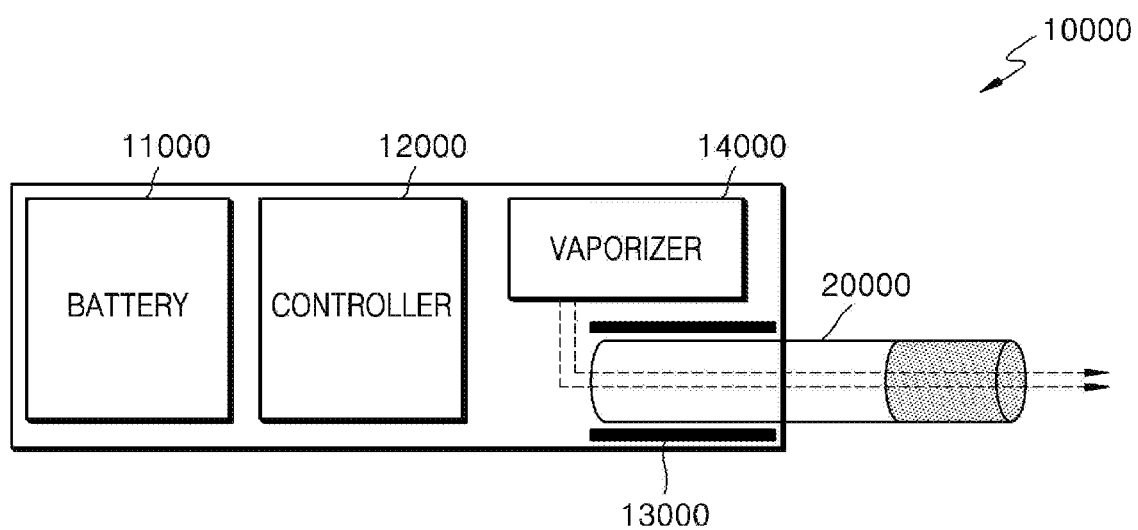

FIGS. 1 through 3 are diagrams showing examples in which a cigarette is inserted into an aerosol generating device.

Referring to FIG. 1, the aerosol generating device 10000 may include a battery 11000, a controller 12000, and a heater 13000. Referring to FIGS. 2 and 3, the aerosol generating device 10000 may further include a vaporizer 14000. Also, the cigarette 20000 may be inserted into an inner space of the aerosol generating device 10000.

FIGS. 1 through 3 illustrate components of the aerosol generating device 10000, which are related to the present exemplary embodiment. Therefore, it will be understood by one of ordinary skill in the art related to the present exemplary embodiment that other general-purpose components may be further included in the aerosol generating device 10000, in addition to the components illustrated in FIGS. 1 through 3.

Also, FIGS. 2 and 3 illustrate that the aerosol generating device 10000 includes the heater 13000. However, according to necessity, the heater 13000 may be omitted.

FIG. 1 illustrates that the battery 11000, the controller 12000, and the heater 13000 are arranged in series. Also, FIG. 2 illustrates that the battery 11000, the controller 12000, the vaporizer 14000, and the heater 13000 are arranged in series. Also, FIG. 3 illustrates that the vaporizer 14000 and the heater 13000 are arranged in parallel. However, the internal structure of the aerosol generating device 10000 is not limited to the structures illustrated in FIGS. 1 through 3. In other words, according to the design of the aerosol generating device 10000, the battery 11000, the controller 12000, the heater 13000, and the vaporizer 14000 may be differently arranged.

When the cigarette 20000 is inserted into the aerosol generating device 10000, the aerosol generating device 10000 may operate the heater 13000 and/or the vaporizer 14000 to generate aerosol from the cigarette 20000 and/or the vaporizer 14000. The aerosol generated by the heater 13000 and/or the vaporizer 14000 is delivered to a user by passing through the cigarette 20000.

According to necessity, even when the cigarette 20000 is not inserted into the aerosol generating device 10000, the aerosol generating device 10000 may heat the heater 13000.

The battery 11000 may supply power to be used for the aerosol generating device 10000 to operate. For example, the battery 11000 may supply power to heat the heater 13000 or the vaporizer 14000, and may supply power for operating the controller 12000. Also, the battery 11000 may supply power for operations of a display, a sensor, a motor, etc. mounted in the aerosol generating device 10000.

The controller 12000 may generally control operations of the aerosol generating device 10000. In detail, the controller 12000 may control not only operations of the battery 11000, the heater 13000, and the vaporizer 14000, but also operations of other components included in the aerosol generating device 10000. Also, the controller 12000 may check a state of each of the components of the aerosol generating device 10000 to determine whether or not the aerosol generating device 10000 is able to operate.

The controller 12000 may include at least one processor. A processor can be implemented as an array of a plurality of logic gates or can be implemented as a combination of a general-purpose microprocessor and a memory in which a program executable in the microprocessor is stored. It will be understood by one of ordinary skill in the art that the processor can be implemented in other forms of hardware.

The heater 13000 may be heated by the power supplied from the battery 11000. For example, when the cigarette 20000 is inserted into the aerosol generating device 10000, the heater 13000 may be located outside the cigarette 20000. Thus, the heated heater 13000 may increase a temperature of an aerosol generating material in the cigarette 20000.

The heater 13000 may include an electro-resistive heater. For example, the heater 13000 may include an electrically conductive track, and the heater 13000 may be heated when currents flow through the electrically conductive track. However, the heater 13000 is not limited to the example described above and may include all heaters which may be heated to a desired temperature. Here, the desired temperature may be pre-set in the aerosol generating device 10000 or may be set as a temperature desired by a user.

As another example, the heater 13000 may include an induction heater. In detail, the heater 13000 may include an electrically conductive coil for heating a cigarette in an induction heating method, and the cigarette may include a susceptor which may be heated by the induction heater.

For example, the heater 13000 may include a tube-type heating element, a plate-type heating element, a needle-type heating element, or a rod-type heating element, and may heat the inside or the outside of the cigarette 20000, according to the shape of the heating element.

Also, the aerosol generating device 10000 may include a plurality of heaters 13000. Here, the plurality of heaters 13000 may be inserted into the cigarette 20000 or may be arranged outside the cigarette 20000. Also, some of the plurality of heaters 13000 may be inserted into the cigarette 20000 and the others may be arranged outside the cigarette 20000. In addition, the shape of the heater 13000 is not limited to the shapes illustrated in FIGS. 1 through 3 and may include various shapes.

The vaporizer 14000 may generate aerosol by heating a liquid composition and the generated aerosol may pass through the cigarette 20000 to be delivered to a user. In other words, the aerosol generated via the vaporizer 14000 may move along an air flow passage of the aerosol generating device 10000 and the air flow passage may be configured such that the aerosol generated via the vaporizer 14000 passes through the cigarette 20000 to be delivered to the user.

For example, the vaporizer 14000 may include a liquid storage, a liquid delivery element, and a heating element, but it is not limited thereto. For example, the liquid storage, the liquid delivery element, and the heating element may be included in the aerosol generating device 10000 as independent modules.

The liquid storage may store a liquid composition. For example, the liquid composition may be a liquid including a tobacco-containing material having a volatile tobacco flavor component, or a liquid including a non-tobacco material. The liquid storage may be formed to be detachable from the vaporizer 14000 or may be formed integrally with the vaporizer 14000.

For example, the liquid composition may include water, a solvent, ethanol, plant extract, spices, flavorings, or a vitamin mixture. The spices may include menthol, peppermint, spearmint oil, and various fruit-flavored ingredients, but are not limited thereto. The flavorings may include ingredients capable of providing various flavors or tastes to a user. Vitamin mixtures may be a mixture of at least one of vitamin A, vitamin B, vitamin C, and vitamin E, but are not limited thereto. Also, the liquid composition may include an aerosol forming substance, such as glycerin and propylene glycol.

The liquid delivery element may deliver the liquid composition of the liquid storage to the heating element. For example, the liquid delivery element may be a wick such as cotton fiber, ceramic fiber, glass fiber, or porous ceramic, but is not limited thereto.

The heating element is an element for heating the liquid composition delivered by the liquid delivery element. For example, the heating element may be a metal heating wire, a metal hot plate, a ceramic heater, or the like, but is not limited thereto. In addition, the heating element may include a conductive filament such as nichrome wire and may be positioned as being wound around the liquid delivery element. The heating element may be heated by a current supply and may transfer heat to the liquid composition in contact with the heating element, thereby heating the liquid composition. As a result, aerosol may be generated.

For example, the vaporizer 14000 may be referred to as a cartomizer or an atomizer, but it is not limited thereto.

The aerosol generating device 10000 may further include general-purpose components in addition to the battery 11000, the controller 12000, the heater 13000, and the vaporizer 14000. For example, the aerosol generating device 10000 may include a display capable of outputting visual information and/or a motor for outputting haptic information. Also, the aerosol generating device 10000 may include at least one sensor (a puff detecting sensor, a temperature detecting sensor, a cigarette insertion detecting sensor, etc.). Also, the aerosol generating device 10000 may be formed as a structure where, even when the cigarette 20000 is inserted into the aerosol generating device 10000, external air may be introduced or internal air may be discharged.

Although not illustrated in FIGS. 1 through 3, the aerosol generating device 10000 and an additional cradle may form together a system. For example, the cradle may be used to charge the battery 11000 of the aerosol generating device 10000. Alternatively, the heater 13000 may be heated when the cradle and the aerosol generating device 10000 are coupled to each other.

The cigarette 20000 may be similar to a general combustive cigarette. For example, the cigarette 20000 may be divided into a first portion including an aerosol generating material and a second portion including a filter, etc. Alternatively, the second portion of the cigarette 20000 may also include an aerosol generating material. For example, an aerosol generating material made in the form of granules or capsules may be inserted into the second portion.

The entire first portion may be inserted into the aerosol generating device 10000, and the second portion may be exposed to the outside. Alternatively, a portion of the first portion may be inserted into the aerosol generating device 10000. Otherwise, the entire first portion and a portion of the second portion may be inserted into the aerosol generating device 10000. The user may puff aerosol while holding the second portion by the mouth of the user. In this case, the aerosol is generated by the external air passing through the first portion, and the generated aerosol passes through the second portion and is delivered to the user's mouth.

For example, the external air may flow into at least one air passage formed in the aerosol generating device 10000. For example, opening and closing of the air passage and/or a size of the air passage may be adjusted by the user. Accordingly, the amount of smoke and smoking satisfaction may be adjusted by the user. As another example, the external air may flow into the cigarette 20000 through at least one hole formed in a surface of the cigarette 20000.

Hereinafter, an example of the cigarette 20000 will be described with reference to FIG. 4.

Figure 4:
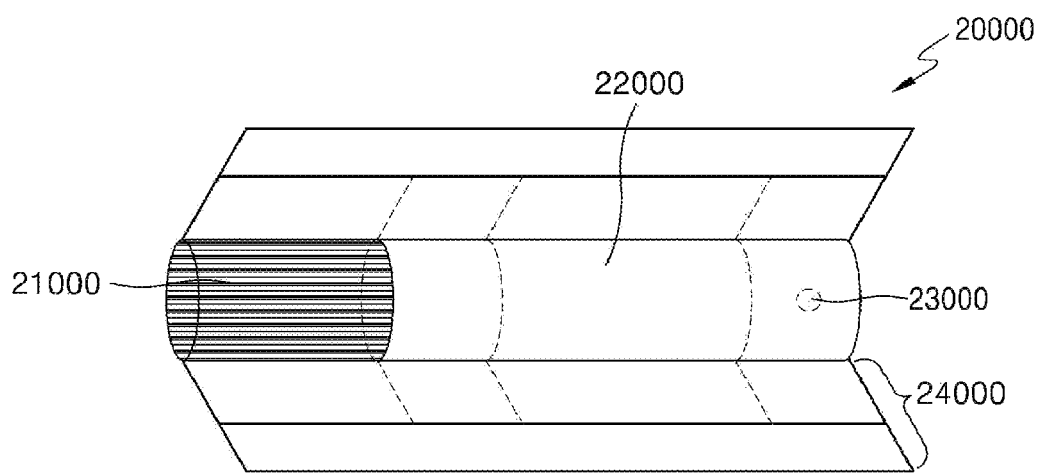
FIG. 4 illustrates an example of the cigarette.

FIG. 4 illustrates an example of a cigarette.

Referring to FIG. 4, the cigarette 20000 may include a tobacco rod 21000 and a filter rod 22000. The first portion described above with reference to FIGS. 1 through 3 may include the tobacco rod, and the second portion may include the filter rod 22000.

FIG. 4 illustrates that the filter rod 22000 includes a single segment. However, the filter rod 22000 is not limited thereto. In other words, the filter rod 22000 may include a plurality of segments. For example, the filter rod 22000 may include a first segment configured to cool aerosol and a second segment configured to filter a certain component included in the aerosol. Also, as necessary, the filter rod 22000 may further include at least one segment configured to perform other functions.

The cigarette 2000 may be packaged using at least one wrapper 24000. The wrapper 24000 may have at least one hole through which external air may be introduced or internal air may be discharged. For example, the cigarette 20000 may be packaged using one wrapper 24000. As another example, the cigarette 20000 may be doubly packaged using at least two wrappers 24000. For example, the tobacco rod 21000 may be packaged using a first wrapper, and the filter rod 22000 may be packaged using a second wrapper. Also, the tobacco rod 21000 and the filter rod 22000, which are respectively packaged using separate wrappers, may be coupled to each other, and the entire cigarette 20000 may be packaged using a third wrapper. When each of the tobacco rod 21000 and the filter rod 22000 includes a plurality of segments, each segment may be packaged using a separate wrapper. Also, the entire cigarette 20000 including the plurality of segments, which are respectively packaged using the separate wrappers may be combined and re-packaged together using another wrapper.

The tobacco rod 21000 may include an aerosol generating material. For example, the aerosol generating material may include at least one of glycerin, propylene glycol, ethylene glycol, dipropylene glycol, diethylene glycol, triethylene glycol, tetraethylene glycol, and oleyl alcohol, but it is not limited thereto. Also, the tobacco rod 21000 may include other additives, such as flavors, a wetting agent, and/or organic acid. Also, the tobacco rod 21000 may include a flavored liquid, such as menthol or a moisturizer, which is injected to the tobacco rod 21000.

The tobacco rod 21000 may be manufactured in various forms. For example, the tobacco rod 21000 may be formed as a sheet or a strand. Also, the tobacco rod 21000 may be formed as a pipe tobacco, which is formed of tiny bits cut from a tobacco sheet. Also, the tobacco rod 21000 may be surrounded by a heat conductive material. For example, the heat-conducting material may be, but is not limited to, a metal foil such as aluminum foil. For example, the heat conductive material surrounding the tobacco rod 21000 may uniformly distribute heat transmitted to the tobacco rod 21000, and thus, the heat conductivity applied to the tobacco rod may be increased and taste of the tobacco may be improved. Also, the heat conductive material surrounding the tobacco rod 21000 may function as a susceptor heated by the induction heater. Here, although not illustrated in the drawings, the tobacco rod 21000 may further include an additional susceptor, in addition to the heat conductive material surrounding the tobacco rod 21000.

The filter rod 22000 may include a cellulose acetate filter. Shapes of the filter rod 22000 are not limited. For example, the filter rod 22000 may include a cylinder-type rod or a tube-type rod having a hollow inside. Also, the filter rod 22000 may include a recess-type rod. When the filter rod 22000 includes a plurality of segments, at least one of the plurality of segments may have a different shape.

The filter rod 22000 may be formed to generate flavors. For example, a flavoring liquid may be injected onto the filter rod 22000, or an additional fiber coated with a flavoring liquid may be inserted into the filter rod 22000.

Also, the filter rod 22000 may include at least one capsule 23000. Here, the capsule 23000 may generate a flavor or aerosol. For example, the capsule 23000 may have a configuration in which a liquid containing a flavoring material is wrapped with a film. For example, the capsule 23000 may have a spherical or cylindrical shape, but is not limited thereto.

When the filter rod 22000 includes a segment configured to cool the aerosol, the cooling segment may include a polymer material or a biodegradable polymer material. For example, the cooling segment may include pure polylactic acid alone, but the material for forming the cooling segment is not limited thereto. In some exemplary embodiments, the cooling segment may include a cellulose acetate filter having a plurality of holes. However, the cooling segment is not limited to the above-described example and any other cooling segment that is capable of cooling the aerosol may be used.

Although not illustrated in FIG. 4, the cigarette 20000 according to an exemplary embodiment may further include a front-end filter. The front-end filter may be located on a side of the tobacco rod 21000, which is the side not facing the filter rod 22000. The front-end filter may prevent the tobacco rod 21000 from being detached outwards and prevent liquefied aerosol from flowing into the aerosol generating device 10000 (FIGS. 1 through 3) from the tobacco rod 21000, during smoking.

Hereinafter, a structure of a heating sheet for manufacturing the heater 13000 of the aerosol generating apparatus 10000 of FIGS. 1 through 3 will be described in detail. Thus, reference numerals used in FIGS. 1 through 3 may also be used in the description of the drawings below.

Figure 5:
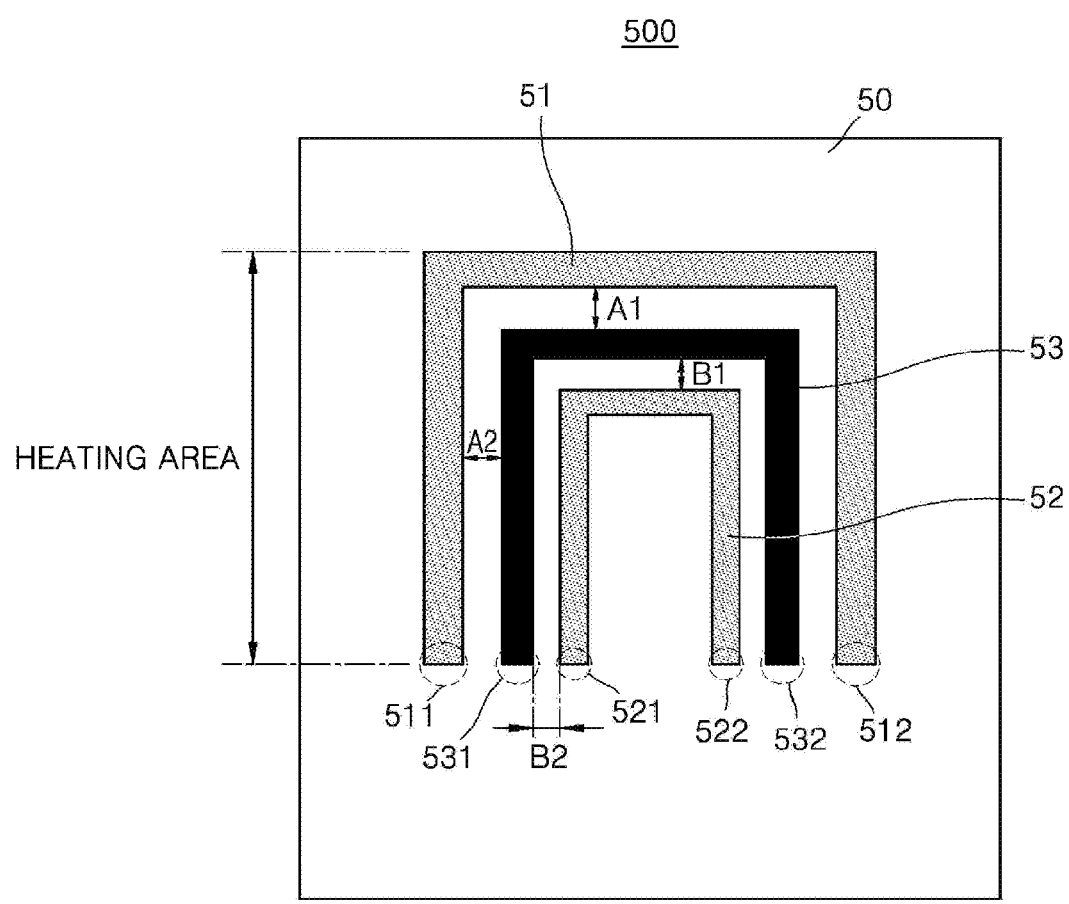
FIG. 5 illustrates a planar structure of a heating sheet according to an exemplary embodiment.

FIG. 5 illustrates a planar structure of a heating sheet according to an exemplary embodiment.

As illustrated in FIG. 1, the heater 13000 may be an internal heater that is manufactured in a shape of a combination of a cylinder and a cone to be inserted into the cigarette 20000. Alternatively, the heater 13000 may be an external heater that is manufactured in a cylinder form (or a tubular form) as illustrated in FIGS. 2 and 3 to heat an outside of the cigarette 20000. FIG. 5 illustrates a planar structure of a heating sheet 500 for manufacturing the heater 13000 (internal heater or external heater).

The heater 13000 may be a heater implemented using an electric resistive element. For example, the heater 13000 may include the heating sheet 500 including an electric resistive heating element such as an electrically conductive track. An electric resistive heating element may be heated as power is supplied from the battery 11000 and thus a current flows through the electric resistive heating element.

For stable use, the heating sheet 500 of the heater 13000 may be supplied with power according to the specifications of 3.2 V, 2.4 A, and 8 W, but the power is not limited thereto. When power is supplied to the heating sheet 500 of the heater 13000, the surface temperature of the heater 13000 may rise to 400° C. or higher. The surface temperature of the heater 13000 may rise to about 350° C. before 15 seconds after the power supply to the heater 13000 starts. However, a range of a temperature increase may vary.

Referring to the planar structure of the heating sheet 500 of the heater 13000, a first electrically conductive heating element 51 and a second electrically conductive heating element 52 which are electrically conductive tracks for heating the cigarette 20000 accommodated in the aerosol generating apparatus 10000 are formed on an electrically insulating substrate 50 of the heating sheet 500. Also, a temperature sensor track 53 for sensing a temperature of the heater 13000 during heating of the electrically conductive heating elements 51 and 52 is formed thereon.

The electrically insulating substrate 50 may correspond to a green sheet formed of a ceramic synthetic material. Alternatively, the electrically insulating substrate 50 may be manufactured using paper, glass, ceramic, anodized metal, coated metal or polyimide. That is, the electrically insulating substrate 50 may be a substrate manufactured using various appropriate materials.

The first electrically conductive heating element 51 and the second electrically conductive heating element 52 may be manufactured as an electric resistive heating element and a heating temperature thereof may be determined according to power consumption due to resistance thereof. Resistance values of the first electrically conductive heating element 51 and the second electrically conductive heating element 52 may be set based on the power consumption.

For example, resistance values of the first electrically conductive heating element 51 and the second electrically conductive heating element 52 may be in a range between 0.7Ω and 0.85Ω at a room temperature of 25 degrees Celsius, but are not limited thereto. The resistance values of the first electrically conductive heating element 51 and the second electrically conductive heating element 52 may be set variously according to a constituent material, length, width, thickness, or pattern or the like of an electric resistive element.

According to resistance temperature coefficient characteristics, internal resistance of the first electrically conductive heating element 51 and the second electrically conductive heating element 52 may increase as a temperature increases. For example, in a certain temperature range, the resistance of the first electrically conductive heating element 51 and the second electrically conductive heating element 52 may be proportional to the temperature.

The first electrically conductive heating element 51 and the second electrically conductive heating element 52 may be manufactured using tungsten, gold, platinum, silver, copper, nickel, palladium, or a combination thereof. In addition, the first electrically conductive heating element 51 and the second electrically conductive heating element 52 may be doped with an appropriate doping material and may include an alloy.

Referring to FIG. 5, on the electrically insulating substrate 50, the first electrically conductive heating element 51 may be formed along a first path at the outer side of the second electrically conductive heating element 52. In addition, on the electrically insulating substrate 50, the second electrically conductive heating element 52 may be formed along a second path at the inner side of the first electrically conductive heating element 51. That is, the planar structure of the heating sheet 500 according to the present embodiment includes a pair of electrically conductive heating elements 51 and 52 formed on the electrically insulating substrate 50.

The first electrically conductive heating element 51 and the second electrically conductive heating element 52 may be respectively formed on the electrically insulating substrate 50 on angled paths having an identical pattern and different ratio sizes. However, the pattern or shape of the first path and the second path of the first electrically conductive heating element 51 and the second electrically conductive heating element 52 may be implemented in various manners, for example, in a curved form or an irregular shape, instead of an angled shape. Furthermore, the pattern or shape of the first path and the second path of the first electrically conductive heating element 51 and the second electrically conductive heating element 52 may be different from each other. However, even so, the first electrically conductive heating element 51 on the electrically insulating substrate 50 may preferably have a bigger pattern or shape than the second electrically conductive heating element 52 and may preferably be formed at the outer side of the second electrically conductive heating element 52.

On the electrically insulating substrate 50, the temperature sensor track 53 is formed along a third path in a region between the first path of the first electrically conductive heating element 51 and the second path of the second electrically conductive heating element 52.

The temperature sensor track 53 senses a temperature of the heater 13000 heated by the first electrically conductive heating element 51 and the second electrically conductive heating element 52. A structure of a ceramic heater according to the conventional art includes only a heating element, and a temperature of the ceramic heater is predicted using a change in a resistance of the heating element. However, according to the conventional method described above, it is difficult to accurately predict an actual temperature of the heating element. Unlike the conventional art, the heating sheet 500 of the heater 13000 according to the present embodiment includes the temperature sensor track 53 located between the electrically conductive heating elements 51 and 52 in a planar structure to uniformly sense a temperature of the electrically conductive heating elements 51 and 52, thereby accurately measuring a temperature of the heater 13000.

The temperature sensor track 53 may also be manufactured using an electric resistive element or an electrically conductive element like the first electrically conductive heating element 51 and the second electrically conductive heating element 52. For example, the temperature sensor track 53 may be manufactured using tungsten, gold, platinum, silver, copper, nickel, palladium, or a combination thereof, and may be doped with an appropriate doping material or may include an alloy.

Referring to the planar structure of the heating sheet 500, the first path of the first electrically conductive heating element 51 is formed at the outer side of the third path of the temperature sensor track 53 on the electrically insulating substrate 50, and the second path of the second electrically conductive heating element 52 is formed at the inner side of the third path of the temperature sensor track 53 at the electrically insulating substrate 50.

The temperature sensor track 53 may be an electrically conductive element having a different thermal coefficient resistance (TCR) or a different resistance value from those of the first electrically conductive heating element 51 and the second electrically conductive heating element 52.

In detail, the first electrically conductive heating element 51 and the second electrically conductive heating element 52 may be electrically conductive elements (or electric resistive elements) having a TCR value between 1200 ppm/° C. and 1800 ppm/° C., and the temperature sensor track 53 may be an electrically conductive element (or electric resistive element) having a TCR value between 3500 ppm/° C. and 4100 ppm/° C. Meanwhile, the first electrically conductive heating element 51 and the second electrically conductive heating element 52 may be electrically conductive elements (or electric resistive elements) having a resistance value between 0.7Ω and 0.85Ω at a room temperature of 25° C., and the temperature sensor track 53 may be an electrically conductive element (or an electric resistive element) having a resistance value between 12Ω and 14Ω at a room temperature of 25° C.

The distance A1 or A2 between the first electrically conductive heating element 51 and the temperature sensor track 53 formed on the electrically insulating substrate 50 may be at least 0.5 mm. In addition, the distance B1 or B2 between the second electrically conductive heating element 52 and the temperature sensor track 53 formed on the electrically insulating substrate 50 may be at least 0.5 mm. However, the above values are exemplary, and the above-described distances may vary according to changes in parameters such as widths, thicknesses or the like of the electrically conductive heating elements 51 and 52 and the temperature sensor track 53.

Meanwhile, referring to the planar structure of the heating sheet 500, the heating sheet 500 may be divided into a heating area where the first electrically conductive heating element 51, the second electrically conductive heating element 52, and the temperature sensor track 53 are formed and a non-heating area where ends of the first electrically conductive heating element 51, the second electrically conductive heating element 52, and the temperature sensor track 53 are to be electrically connected to the battery 11000. However, in FIG. 5, only the heating area is illustrated for convenience of description.

In the heating area, the first electrically conductive heating element 51 includes a first end 511 and a second end 512 on the first path. In the heating area, the second electrically conductive heating element 52 includes a third end 521 and a fourth end 522 on the second path. In the heating area, the temperature sensor track 53 includes a fifth end 531 and a sixth end 532 on the third path.

Here, the fifth end 531 of the temperature sensor track 53 is located between the first end 511 of the first electrically conductive heating element 51 and the third end 521 of the second electrically conductive heating element 52 in the heating area, and the sixth end 532 of the temperature sensor track 53 is located between the second end 512 of the first electrically conductive heating element 51 and the fourth end 522 of the second electrically conductive heating element 52 in the heating area.

The non-heating area will be described in detail with reference to FIG. 6.

Figure 6:
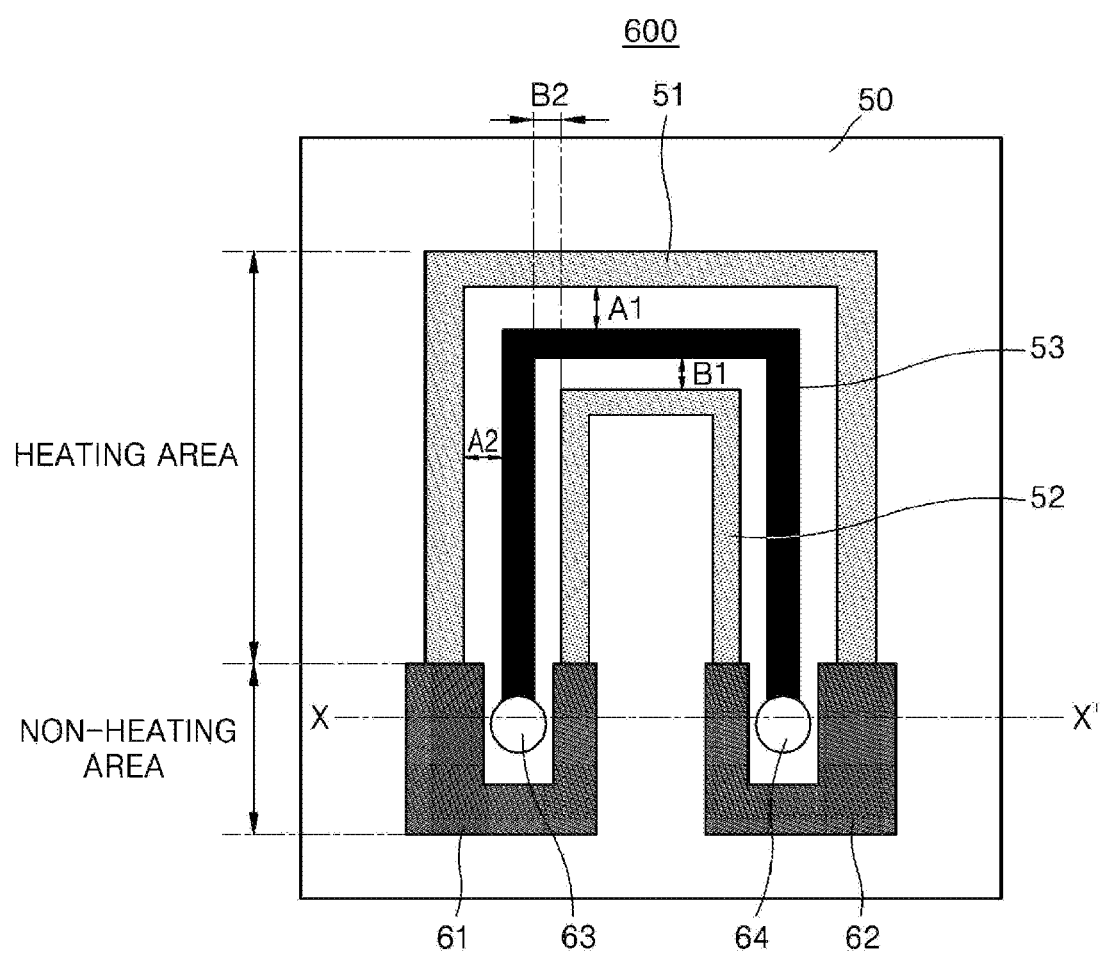
FIG. 6 illustrates a detailed view of a planar structure of a heating sheet according to an exemplary embodiment.

FIG. 6 illustrates a detailed view of a planar structure of a heating sheet according to an exemplary embodiment.

Referring to a planar structure of a heating sheet 600 of the heater 13000 illustrated in FIG. 6, a heating area and a non-heating area are distinguished. In the heating area of the heating sheet 600, as described above with reference to FIG. 5, the first electrically conductive heating element 51, the temperature sensor track 53 at the inner side of the first electrically conductive heating element 51, and the second electrically conductive heating element 52 at the inner side of the temperature sensor track 53 are formed.

The non-heating area of the heating sheet 600 includes a first connection portion 61 connecting the first end 511 and the third end 521 described with reference to FIG. 5 to the battery 11000 and a second connection portion 62 connecting the second end 512 and the fourth end 522 described with reference to FIG. 5 to the battery 11000. That is, the first connection portion 61 and the second connection portion 62 correspond to electric coupling terminals providing power, which is supplied from the battery 11000, to the first electrically conductive heating element 51 and the second electrically conductive heating element 52.

Meanwhile, the non-heating area includes a pair of via holes 63 and 64 respectively formed in the fifth end 531 and the sixth end 532 described with reference to FIG. 5. The pair of via holes 63 and 64 are electrically connected to the controller 12000. That is, as temperature information sensed by the temperature sensor track 53 is delivered to the controller 12000 via the via holes 63 and 64, the controller 12000 may monitor a temperature of the heater 13000.

The first connection portion 61 and the second connection portion 62 may be manufactured using an electrically conductive element (or electric resistive element) that is identical to the first electrically conductive heating element 51 and the second electrically conductive heating element 52. However, since the first connection portion 61 and the second connection portion 62 are located in the non-heating area, the first connection portion 61 and the second connection portion 62 may preferably be manufactured to have a greater width or thickness than the first electrically conductive heating element 51 and the second electrically conductive heating element 52 so as to have a lower temperature than the heating area.

Figure 7:
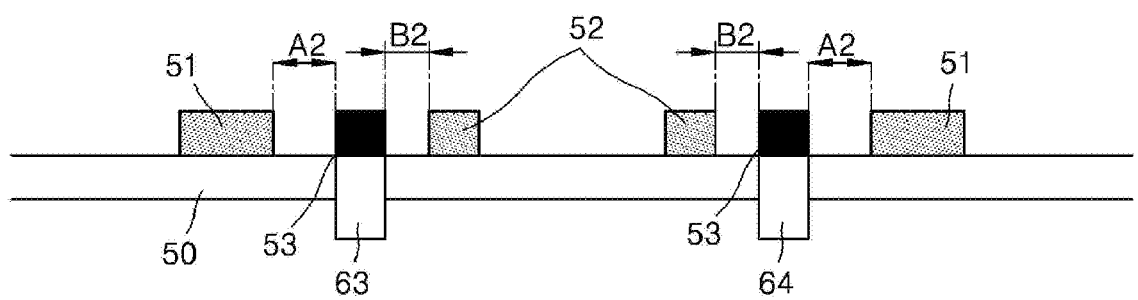
FIG. 7 is a cross-sectional view of the planar structure of the heating sheet of FIG. 6, taken along line X-X' and viewed from a side.

FIG. 7 is a cross-sectional view of the planar structure of the heating sheet of FIG. 6, taken along line X-X'.

Referring to FIG. 7, the first electrically conductive heating element 51, the second electrically conductive heating element 52, and the temperature sensor track 53 are all formed on an upper surface of the electrically insulating substrate 50. However, the via holes 63 and 64 which electrically connect the temperature sensor track 53 and the controller 12000 may penetrate the electrically insulating substrate 50.

Figure 8:
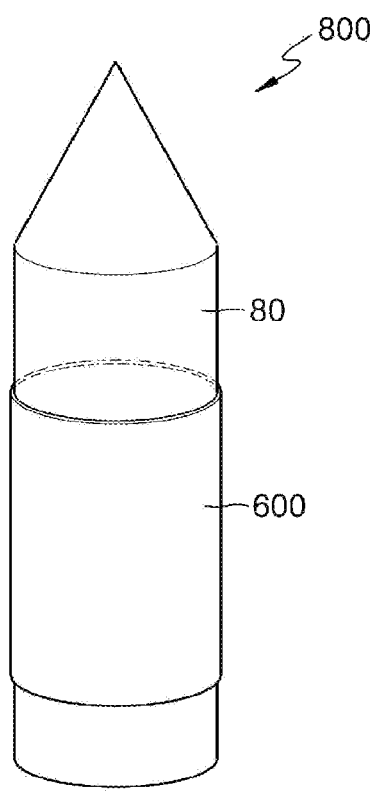
FIGS. 8 and 9 are diagrams illustrating heaters manufactured using the heating sheet of FIG. 6.
Figure 9:
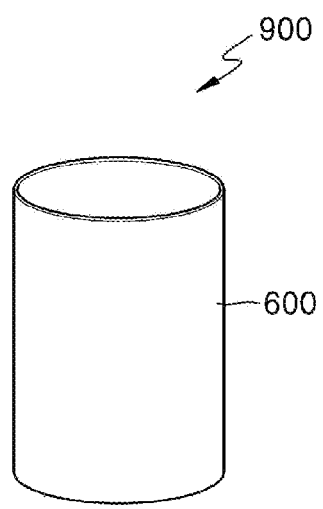

FIGS. 8 and 9 are diagrams illustrating heaters manufactured using the heating sheet of FIG. 6.

FIG. 8 illustrates the heater 13000 to implement an internal heater shape 800 to be inserted into the cigarette 20000 that is manufactured in the shape of a combination of a cylinder and a cone as described with reference to FIG. 1. In detail, the heater 13000 of FIG. 1 corresponding to the internal heater shape 800 may be formed using the heating sheet 600 of FIG. 6 that is integrally formed with and surrounds a structure 80 having a shape of a combination of a cylinder and a cone. Here, the upper surface of the electrically insulating substrate 50 described with reference to FIG. 7, that is, a layer on which the electrically conductive heating elements 51 and 52 and the temperature sensor track 53 are formed, may surround an outer portion of the structure 80 to face the outside.

FIG. 9 illustrates the heater 13000 implemented in an external heater shape 900 that heats an outer portion of the cigarette 20000 described with reference to FIG. 2 or FIG. 3. In detail, the heater 13000 of FIG. 2 or FIG. 3, which correspond to the external heater shape 900, may be manufactured by rolling the heating sheet 600 of FIG. 6 into a hollow cylinder shape or a tubular shape such that the cigarette 20000 is accommodated in its internal space and heated. Here, the upper surface of the electrically insulating substrate 50 described with reference to FIG. 7, that is, a layer on which the electrically conductive heating elements 51 and 52 and the temperature sensor track 53 are formed, may face the internal space.

Figure 10:
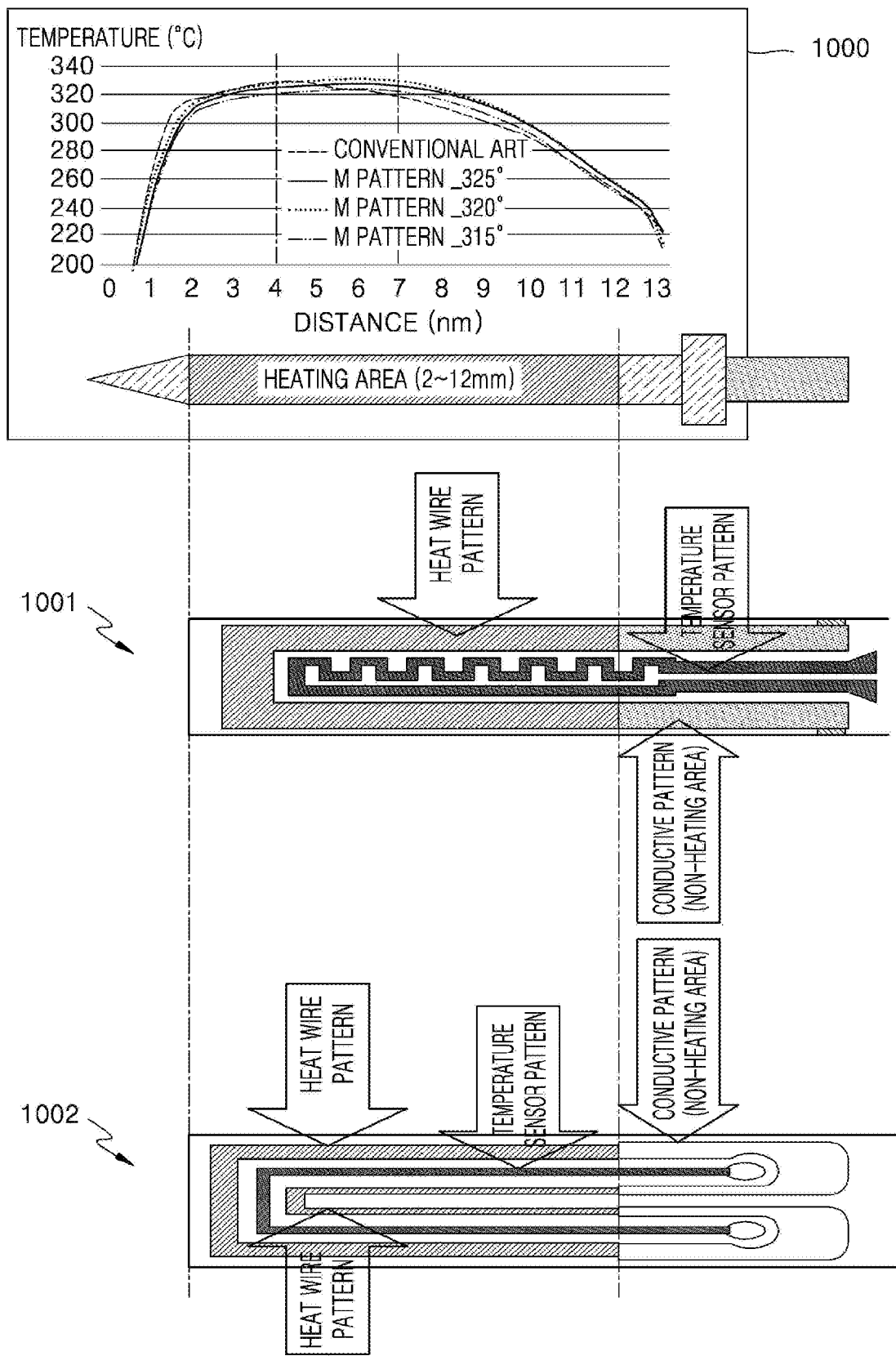
FIG. 10 is a diagram for describing simulation results of temperature sensing according to different implementation methods of a temperature sensor track.

FIG. 10 is a diagram for describing simulation results of temperature sensing according to different implementation methods of a temperature sensor track.

Referring to FIG. 10, in an implementation example 1001, an electrically conductive heating element is arranged in an outermost portion, and a temperature sensor track is arranged at the inner side of the electrically conductive heating element.

On the other hand, in an implementation example 1002, as described above with reference to FIG. 6 according to the an exemplary embodiment, a first electrically conductive heating element is arranged in an outermost portion while a temperature sensor track is arranged at the inner side of the first electrically conductive heating element, and a second electrically conductive heating element is additionally arranged in an innermost portion of the temperature sensor track (M pattern).

Referring to a temperature sensing result 1000 at a distance between 4 mm and 7 mm in the heating area, it can be seen that a temperature sensed using the temperature sensor track of the implementation example 1001 gradually decreases as the distance increases. In other words, a temperature sensed using the temperature sensor track of the implementation example 1001 is not uniform at the distance between 4 mm and 7 mm, and thus, it is difficult to measure an accurate heater temperature.

However, it is shown that the temperature sensor track of the implementation example 1002 according to the present exemplary embodiment senses a temperature almost uniformly at the distance between 4 mm and 7 mm under various temperature settings such as 325° C., 320° C., and 315° C. That is, by arranging electrically conductive heating elements and a temperature sensor track of the implementation example 1002 according to an exemplary embodiment, a temperature in a heating portion of a heater may be sensed uniformly and accurately.

Those of ordinary skill in the art related to the present exemplary embodiments can understand that various changes in form and details can be made therein without departing from the scope of the characteristics described above. The disclosed methods should be considered in descriptive sense only and not for purposes of limitation. Therefore, the scope of the present disclosure is defined not by the detailed description of the disclosure but by the appended claims, and all differences within the scope will be construed as being included in the present disclosure.

What is claimed is:

1. An aerosol generating apparatus comprising:
a heater including:
a first electrically conductive heating element formed along a first path on an electrically insulating substrate and having a first end and a second end;
a second electrically conductive heating element formed along a second path on the electrically insulating substrate and having a third end and a fourth end;
a first connection portion connecting the first end of the first electrically conductive heating element with the third end of the second electrically conductive heating element, wherein a width of the first connection portion is different from a width of the first electrically conductive heating element or a width of the second electrically conductive heating element; and
a second connection portion connecting the second end of the first electrically conductive heating element with the fourth end of the second electrically conductive heating element, the second connection portion separated from the first connection portion, wherein a width of the second connection portion is different from the width of the first electrically conductive heating element or the width of the second electrically conductive heating element,
a battery providing the heater with power; and
a controller controlling the power from the battery to the heater.

2. The aerosol generating apparatus of claim 1, further comprising a temperature sensor track formed along a third path between the first path and the second path,
wherein the first path is formed at an outer side of the third path on the electrically insulating substrate, and
the second path is formed at an inner side of the third path on the electrically insulating substrate.

3. The aerosol generating apparatus of claim 1, further comprising a temperature sensor track formed along a third path between the first path and the second path,
wherein the controller monitoring a sensed temperature from the temperature sensor track, and
wherein the first electrically conductive heating element and the second electrically conductive heating element are heated by supply of the power, and
the temperature sensor track senses a temperature of the heater heated by the first electrically conductive heating element and the second electrically conductive heating element.

4. The aerosol generating apparatus of claim 2, wherein the heater comprises:
a first area in which the first electrically conductive heating element, the second electrically conductive heating element, and the temperature sensor track are formed; and
a second area in which the ends of the first electrically conductive heating element and the second electrically conductive heating element are to be electrically connected to the battery through the first connection portion and the second connection portion.

5. The aerosol generating apparatus of claim 3, wherein the temperature sensor track comprises a fifth end and a sixth end which are on the third path in the first area or the second area,
the fifth end is located between the first end and the third end in the first area or the second area, and
the sixth end is located between the second end and the fourth end in the first area or the second area.

6. The aerosol generating apparatus of claim 5, wherein the first connection portion electrically connecting the first end and the third end to the battery,
- the second connection portion electrically connecting the second end and the fourth end to the battery, and
- a pair of via holes respectively formed adjacent to the fifth end and the sixth end.

7. The aerosol generating apparatus of claim 1, wherein the width of the first connection portion is greater than the width of the first electrically conductive heating element or the width of the second electrically conductive heating element, and wherein the width of the second connection portion is greater than the width of the first electrically conductive heating element or the width of the second electrically conductive heating element.

8. The aerosol generating apparatus of claim 2, wherein the temperature sensor track comprises an electrically conductive element having a different thermal coefficient resistance (TCR) or a different resistance value from the first electrically conductive heating element and the second electrically conductive heating element.

9. The aerosol generating apparatus of claim 8, wherein
- the first electrically conductive heating element and the second electrically conductive heating element have a TCR value between 1200 ppm/° C. and 1800 ppm/° C., and
- the temperature sensor track has a TCR value between 3500 ppm/° C. and 4100 ppm/° C.

10. The aerosol generating apparatus of claim 8, wherein
- the first electrically conductive heating element and the second electrically conductive heating element have a resistance value between 0.7Ω and 0.85Ω at a room temperature of 25° C., and
- the temperature sensor track has a resistance value between 12Ω and 14Ω at the room temperature of 25° C.

11. The aerosol generating apparatus of claim 2, wherein a distance between the temperature sensor track and the first electrically conductive heating element and a distance between the temperature sensor track and the second electrically conductive heating element are each at least 0.5 mm.

12. The aerosol generating apparatus of claim 1, wherein the heater is implemented as an internal heater to be inserted into a cigarette to heat the cigarette or as an external heater to heat an outer portion of the cigarette.

13. A heater for an aerosol generating apparatus comprising:
- a first electrically conductive heating element formed along a first path on an electrically insulating substrate and having a first end and a second end; and
- a second electrically conductive heating element formed along a second path on the electrically insulating substrate and having a third end and a fourth end;
- a first connection portion connecting the first end of the first electrically conductive heating element with the third end of the second electrically conductive heating element, wherein a width of the first connection portion is greater than a width of the first electrically conductive heating element or a width of the second electrically conductive heating element; and
- a second connection portion connecting the second end of the first electrically conductive heating element with the fourth end of the second electrically conductive heating element, the second connection portion separated from the first connection portion, wherein a width of the second connection portion is greater than the width of the first electrically conductive heating element or the width of the second electrically conductive heating element.

* * * * *